United States Patent
Hwang et al.

(10) Patent No.: US 8,531,879 B2
(45) Date of Patent: Sep. 10, 2013

(54) SEMICONDUCTOR MEMORY DEVICE AND AN OPERATING METHOD THEREOF

(75) Inventors: Sangwon Hwang, Suwon-si (KR); DongKyu Youn, Ansan-si (KR); Jong-Nam Baek, Hwaseong-si (KR); Su Chang Jeon, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 245 days.

(21) Appl. No.: 13/080,197

(22) Filed: Apr. 5, 2011

(65) Prior Publication Data
US 2011/0286270 A1     Nov. 24, 2011

(30) Foreign Application Priority Data
May 19, 2010    (KR) .................. 10-2010-0046987

(51) Int. Cl.
*G11C 11/34*     (2006.01)
(52) U.S. Cl.
USPC ............. 365/185.08; 365/230.03; 365/238.5; 365/63; 365/230.09
(58) Field of Classification Search
USPC .......... 365/185.08, 230.03, 238.5, 63, 230.09
See application file for complete search history.

(56) References Cited

U.S. PATENT DOCUMENTS

| | | | |
|---|---|---|---|
| 6,421,274 B1 | 7/2002 | Yoshimura | |
| 6,775,185 B2 | 8/2004 | Fujisawa et al. | |
| 6,842,375 B1 * | 1/2005 | Raszka | 365/185.18 |
| 7,440,324 B2 * | 10/2008 | Mokhlesi | 365/185.17 |
| 7,495,963 B2 * | 2/2009 | Edahiro et al. | 365/185.21 |
| 7,571,276 B2 | 8/2009 | Cho et al. | |

FOREIGN PATENT DOCUMENTS

| | | |
|---|---|---|
| JP | 2002-288034 | 10/2002 |
| JP | 2003-317487 | 11/2003 |
| KR | 1020030082917 | 10/2003 |
| KR | 1020070037872 | 4/2007 |

\* cited by examiner

*Primary Examiner* — Son Dinh
(74) *Attorney, Agent, or Firm* — F. Chau & Associates, LLC

(57) ABSTRACT

A semiconductor memory device including a flash memory that includes a page, wherein the page includes a plurality of memory cells connected to even bitlines and odd bitlines of the flash memory, and the memory cells are disposed in a plurality of sectors. The semiconductor memory device also includes a memory controller configured to provide the flash memory with a read address that identifies sectors to be read. The flash memory is configured to determine a sequence of even sensing and odd sensing based on the read address and perform the even sensing and the odd sensing according to the determined sequence. In addition, the flash memory is configured to sense data of at least one identified sector that includes memory cells connected to the even bitlines during the even sensing and sense data of at least one identified sector that includes memory cells connected to the odd bitlines during the odd sensing.

15 Claims, 7 Drawing Sheets

SEMICONDUCTOR MEMORY DEVICE AND AN OPERATING METHOD THEREOF

CROSS-REFERENCE TO RELATED APPLICATION

This U.S. non-provisional patent application claims priority under 35 U.S.C. §119 to Korean Patent Application No. 10-2010-0046987, filed on May 19, 2010, the disclosure of which is incorporated by reference herein in its entirety.

BACKGROUND

1. Technical Field

The present inventive concept relates to semiconductor memory devices and, more particularly, to a semiconductor memory device including a flash memory and a random access memory (RAM) and an operating method thereof.

2. Discussion of Related Art

Generally, semiconductor memory devices are categorized as volatile memory devices or non-volatile memory devices. The volatile memory devices are classified into dynamic random access memory (DRAM) devices, which use a capacitor and a transistor per bit, and static random access memory (SRAM) devices, which rely on several transistors per bit, for example. The volatile memory devices generally operate at a higher speed than the non-volatile memory devices but require power to maintain their stored data.

The non-volatile memory devices include mask read-only memory (MROM) devices, programmable read-only memory (PROM) devices, erasable programmable read-only memory (EPROM) devices, and electrically erasable programmable read-only memory (EEPROM) devices, for example. The non-volatile memory devices can retain their stored data when not powered but have lower read/write speeds than the volatile memory devices.

However, data stored in MROM devices and PROM devices is not rewritable, and data stored in EPROM devices can be rewritten but an EPROM usually must be removed from the device for erasing and programming. On the other hand, EEPROM devices can be erased and reprogrammed repeatedly through the application of an electrical voltage generated externally or internally, and thus, are increasingly used in system programming that is continuously updated or as auxiliary memory devices.

Flash memory devices, which are a specific type of EEPROM device, are increasingly used as mass storage devices because their integration density is higher than traditional EEPROM devices. Among the flash memory devices, a NAND flash memory device has a higher integration density than a NOR flash memory device. As flash memory devices, such as a high-density NAND flash memory device, continue to be adopted in a variety of devices, there is a need for a flash memory device with improved operability.

SUMMARY

An exemplary embodiment of the inventive concept provides a semiconductor memory device. The semiconductor memory device may include: a flash memory including a page, wherein the page includes a plurality of memory cells connected to even bitlines and odd bitlines of the flash memory, and the memory cells are disposed in a plurality of sectors; and a memory controller configured to provide the flash memory with a read address that identifies sectors to be read. The flash memory may be configured to determine a sequence of even sensing and odd sensing based on the read address and perform the even sensing and the odd sensing according to the determined sequence. The flash memory may be configured to sense data of at least one identified sector that includes memory cells connected to the even bitlines during the even sensing and sense data of at least one identified sector that includes memory cells connected to the odd bitlines during the odd sensing.

In an exemplary embodiment of the inventive concept, the memory cells connected to the even bitlines may be included in a first sector group and the memory cells connected to the odd bitlines may be included in a second sector group. The first sector group may include the at least one identified sector that includes memory cells connected to the even bitlines and the second sector group includes the at least one identified sector that includes memory cells connected to the odd bitlines.

In an exemplary embodiment of the inventive concept, the flash memory may be configured to compare a number of identified sectors included in the first sector group and a number of identified sectors included in the second sector group and determine the sequence of the even sensing and the odd sensing according to a result of the comparison.

In an exemplary embodiment of the inventive concept, the flash memory may be configured to sequentially perform the even sensing and the odd sensing when the number of identified sectors included in the first sector group is greater than the number of identified sectors included in the second sector group. The flash memory may be configured to sequentially perform the odd sensing and the even sensing when the number of identified sectors included in the second sector group is greater than the number of identified sectors included in the first sector group.

In an exemplary embodiment of the inventive concept, the semiconductor memory device may further include a random access memory (RAM). The flash memory may be configured to transfer the data sensed during the even sensing and the data sensed during the odd sensing to the RAM.

In an exemplary embodiment of the inventive concept, when the odd sensing follows the even sensing, the flash memory may be configured to transfer the data sensed during the even sensing to the RAM while the odd sensing takes place.

In an exemplary embodiment of the inventive concept, when the even sensing follows the odd sensing, the flash memory may be configured to transfer the data sensed during the odd sensing to the RAM while the even sensing takes place.

In an exemplary embodiment of the inventive concept, the flash memory and the memory controller may be included in a solid state drive (SSD).

In an exemplary embodiment of the inventive concept, the flash memory and the memory controller may be included in a memory card.

In an exemplary embodiment of the inventive concept, the flash memory may further include a read/write circuit connected to the even bitlines and the odd bitlines; and a control logic configured to control the read/write circuit and generate an even line selection signal and an odd line selection signal based on the read address.

In an exemplary embodiment of the inventive concept, the memory cells connected to the even bitlines may be included in a first sector group, the first sector group including the at least one identified sector that includes memory cells connected to the even bitlines, and the memory cells connected to the odd bitlines may be included in a second sector group, the second sector group including the at least one identified sector that includes memory cells connected to the odd bitlines.

The control logic may sequentially generate the odd line selection signal and the even line selection signal when the number of identified sectors included in the second sector group greater than the number of identified sectors included in the first sector group. The control logic may sequentially generate the even line selection signal and the odd line selection signal when the number of identified sectors included in the first sector group is greater than the number of identified sectors included in the second sector group.

In an exemplary embodiment of the inventive concept, the read/write circuit may perform the even sensing in response to the even line selection signal and the odd sensing in response to the odd line selection signal.

In an exemplary embodiment of the inventive concept, the read/write circuit may include a plurality of page buffers connected to the even bitlines and the odd bitlines respectively and store the data sensed during the even sensing in the page buffers connected to the even bitlines and the data sensed during the odd sensing in the page buffers connected to the odd bitlines.

In an exemplary embodiment of the inventive concept, the semiconductor memory device may further include a RAM. The read/write circuit may transfer the data stored in the page buffers connected to the even bitlines to the RAM during the odd sensing when the odd sensing follows the even sensing, or transfer the data stored in the page buffers connected to the odd bitlines during the even sensing when the even sensing follows the odd sensing.

An exemplary embodiment of the inventive concept provides a method of operating a semiconductor memory device, wherein the semiconductor memory device includes a flash memory and a memory controller, the flash memory including a page, wherein the page includes a plurality of memory cells connected to even bitlines and odd bitlines of the flash memory, and the memory cells are disposed in a plurality of sectors. The method may include receiving, at the flash memory, a read address from the memory controller, wherein the read address identifies sectors to be read; determining, at the flash memory, a sequence of even sensing and odd sensing, based on the read address; and performing, at the flash memory, the even sensing and the odd sensing according to the determined sequence. Data of at least one identified sector that includes memory cells connected to the even bitlines may be sensed during the even sensing and data of at least one identified sector that includes memory cells connected to the odd bitlines may be sensed during the odd sensing.

In an exemplary embodiment of the inventive concept, the memory cells connected to the even bitlines may be included in a first sector group, the first sector group including the at least one identified sector that includes memory cells connected to the even bitlines, and the memory cells connected to the odd bitlines may be included in a second sector group, the second sector group including the at least one identified sector that includes memory cells connected to the odd bitlines. The determining of the sequence of even sensing and odd sensing may include comparing a number of identified sectors included in the first sector group and a number of identified sectors included in the second sector group and determining the sequence of the even sensing and the odd sensing according to a result of the comparison.

In an exemplary embodiment of the inventive concept, the determining of the sequence of even sensing and odd sensing may include sequentially performing the odd sensing and the even sensing when the number of identified sectors included in the second sector group is greater than the number of identified sectors included in the first sector group; and sequentially performing the even sensing and the odd sensing when the number of identified sectors included in the first sector group is greater than the number of identified sectors included in the second sector group.

In an exemplary embodiment of the inventive concept, the semiconductor memory device further comprises a RAM. The performing of the even sensing and the odd sensing may include transferring the data sensed during the even sensing to the RAM while the odd sensing takes place when the odd sensing follows the even sensing, or transferring the data sensed during the odd sensing to the RAM while the even sensing takes place when the even sensing follows the odd sensing.

In an exemplary embodiment of the inventive concept, the method may further include receiving a clock signal from an external entity; and outputting the data transferred to the RAM to the external entity in response to the clock signal.

An exemplary embodiment of the inventive concept provides a semiconductor memory device. The semiconductor memory device may include a first memory including a page, wherein the page includes a plurality of memory cells connected to first bitlines and second bitlines of the first memory, and in response to an address received by the first memory, the first memory is configured to sense data from the memory cells connected to the first bitlines and then sense data from the memory cells connected to the second bitlines, and while the data is sensed from the memory cells connected to the second bitlines, the data sensed from the memory cells connected to the first bitlines is output from the first memory.

BRIEF DESCRIPTION OF THE DRAWINGS

The above and other features of the inventive concept will become more apparent by describing in detail exemplary embodiments thereof with reference to the attached drawings.

DETAILED DESCRIPTION OF THE EMBODIMENTS

Exemplary embodiments of the inventive concept will now be described more fully hereinafter with reference to the accompanying drawings. However, the inventive concept may be embodied in many different forms and should not be construed as limited to the embodiments set forth herein. Like numbers may refer to like elements throughout the specification and drawings.

Figure 1:
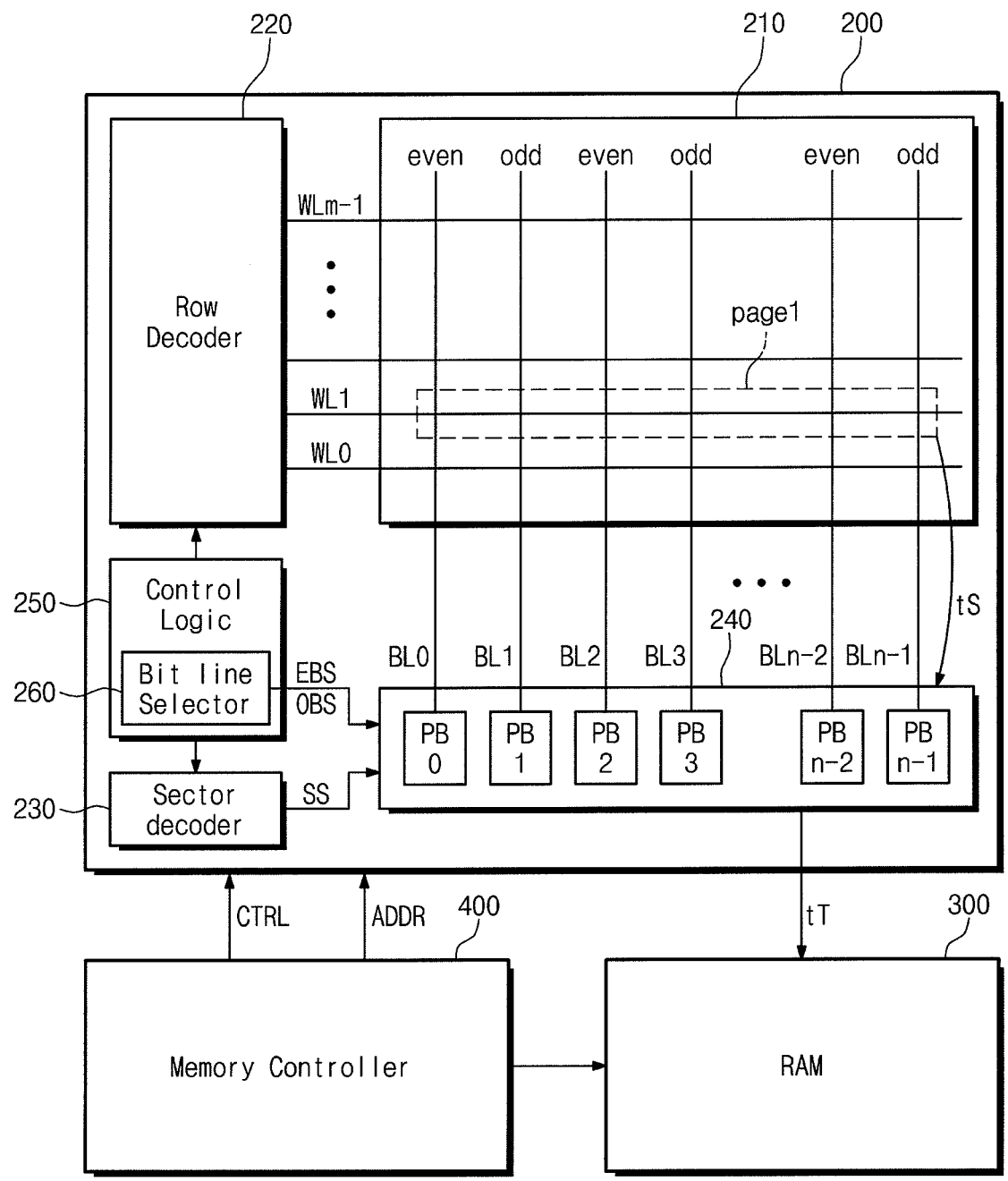
FIG. 1 is a block diagram of a semiconductor memory device according to an exemplary embodiment of the inventive concept.

FIG. 1 is a block diagram of a semiconductor memory device 100 according to an exemplary embodiment of the inventive concept. As illustrated, the semiconductor memory device 100 includes a flash memory 200, a random access memory (RAM) 300, and a memory controller 400.

The flash memory 200 is configured to operate in response to the control of the memory controller 400. The flash memory 200 receives a control signal CTRL and an address ADDR from the memory controller 400. For example, the address ADDR may include a block address, a page address, and a sector address. For example, the address ADDR may be a physical address. The flash memory 200 transfers data to the RAM 300 corresponding to the address ADDR in response to a control signal CTRL.

The RAM 300 is configured to operate in response to the control of the memory controller 400. The RAM 300 stores data to be stored in the flash memory 200 or data transferred from the flash memory 200. As an example, data transferred to the RAM 300 may be read to a host (not shown) in response to a clock signal (not shown) received from the host. In the flash memory 200, data is not lost when it is not powered. On the other hand, in the RAM 300, data is lost when it is not powered. The RAM 300 may be configured using a dynamic random access memory (DRAM) or a static random access memory (SRAM).

The memory controller 400 is configured to control an overall operation of the semiconductor memory device 100. The memory controller 400 is configured to control the flash memory 200 and the RAM 300. As an example, the memory controller 400 is configured to access the flash memory 200 in response to a request from the host (not shown). For example, the memory controller 400 is configured to effectuate a sensing operation of the flash memory 200 and a data transfer between the flash memory 200 and the RAM 300. The memory controller 400 is configured to drive firmware for controlling the flash memory 200 and the RAM 300.

The flash memory 200 includes a memory cell array 210, a row decoder 220, a sector decoder 230, a read/write circuit 240, and a control logic 250.

The memory cell array 210 is connected to the row decoder 220 through zeroth to (m−1)th wordlines WL0~WLm-1 and the read/write circuit 240 through zeroth to (n−1)th bitlines BL0~BLn-1.

The memory cell array 210 includes a plurality of memory blocks (not shown). Each of the memory blocks includes a plurality of pages each including a plurality of memory cells. Memory cells arranged in a row direction are connected to the zeroth to (m−1)th wordlines WL0~WLm-1. In the case of a single-level cell (SLC), memory cells connected to one wordline may constitute one page. In the case that memory cells are multi-level cells (MLCs), memory cells connected to one wordline may constitute a plurality of pages. Memory cells arranged in a column direction are connected to the zeroth to (n−1)th bitlines BL0~BLn-1. Referring to FIG. 1, the zeroth to (n−1)th bitlines BL0~BLn-1 include even bitlines and odd bitlines.

A plurality of memory cells included in each page are accessed in unit sectors. Each sector corresponds to memory cells connected to even bitlines or memory cells connected to odd bitlines. As an example, each sector may correspond to memory cells connected to even bitlines or memory cells connected to odd bitlines according to a predetermined standard, which will be described later in detail with reference to FIGS. 2 and 3.

The row decoder 220 is connected to the memory cell array 210 through the zeroth to (m−1)th wordlines WL0~WLm-1. The row decoder 220 is configured to operate in response to the control of the control logic 250. The row decoder 220 is configured to decode a block address of the address ADDR received at the flash memory 200. The row decoder 220 may select one page based on a decoded block address and a decoded column address. As an example, the row decoder 220 may include an address buffer.

The sector decoder 230 is connected to the read/write circuit 240. The sector decoder 230 operates in response to the control of the control logic 250. The sector decoder 230 is configured to decode a sector address of the address ADDR received at the flash memory 200. As an example, a sector address may include a start sector address and the number of sectors. A decoded sector address SS is transferred to the read/write circuit 240. As an example, the sector decoder 230 may include an address buffer.

The read/write circuit 240 is connected to the memory cell array 210 through the zeroth to (n−1)th bitlines BL0~BLn-1. As an example, the read/write circuit 240 may include a plurality of page buffers PB0~PBn-1. The page buffers PB0~PBn-1 may be connected to the zeroth to (n−1)th bitlines BL0~BLn-1, respectively.

The read/write circuit 240 operates in response to the control of the control logic 250. The read/write circuit 240 receives an even bitline selection signal EBS and an odd bitline selection signal OBS from a bitline selector 260. The read/write circuit 240 senses data of memory cells connected to even bitlines in response to the even bitline selection signal EBS (hereinafter referred to as "even sensing"). The read/write circuit 240 senses data of memory cells connected to odd bitlines in response to the odd bitline selection signal OBS (hereinafter referred to as "odd sensing"). The read/write circuit 240 may perform even sensing and odd sensing to sense data of one page. Referring to FIG. 1, sensing time tS may be required when the read/write circuit 240 senses data of one page.

The read/write circuit 240 receives a decoded sector address SS. Based on the decoded sector address SS, the read/write circuit 240 transfers the sensed data of one page to the RAM 300. The read/write circuit 240 transfers data of sectors corresponding to a sector address, among the sensed data of one page, to the RAM 300. The larger the number of sectors transferred to the RAM 300, the longer the transfer time. As an example, the read/write circuit 240 may include a sector selector. Referring to FIG. 1, transfer time tT is required when sensed data is transferred to the RAM 300.

The control logic 250 is connected to the row decoder 220, the sector decoder 230, and the read/write circuit 240. The control logic 250 is configured to control an overall operation of the flash memory 200. The control logic 250 operates in response to a control signal CTRL transferred from the memory controller 400.

According to an exemplary embodiment of the inventive concept, the control logic 250 includes the bitline selector 260. The bitline selector 260 determines a sequence of even sensing and odd sensing, based on the sector address of the address ADDR. When the even sensing is followed by the odd sensing, the bitline selector 260 may generate an even bitline selection signal EBS after generating an odd bitline selection signal OBS. When the odd sensing is followed by the even sensing, the bitline selector 260 may generate an odd bitline selection signal OBS after generating an even bitline selection signal EBS.

During an odd sensing preceded by an even sensing, the read/write circuit 240 transfers data corresponding to a sector address, among even-sensed data, to the RAM 300. During an even sensing preceded by an odd sensing, the read/write circuit 240 transfers data corresponding to a sector address, among odd-sensed data, to the RAM 300.

The semiconductor memory device 100 may constitute a memory card. As an example, the flash memory 200 and the memory controller 400 may be integrated into a single semiconductor device to constitute a memory card. For example, the memory device 100 may constitute a memory card such as a PC card (PCMCIA), a compact flash card (CF), a smart media card (SM/SMC), a memory stick, a multimedia card (MMC, reduced-size (RS)-MMC, or MMCmicro), a secure digital card (SD, miniSD, microSD, or SD high capacity (HC)) or a universal flash storage (UFS).

The memory device 100 may constitute a solid state disk/drive (SSD). As an example, the flash memory 200 and the memory controller 400 may be integrated into a single semiconductor device to constitute an SSD. The SSD includes a storage device configured to store data in a semiconductor memory. When the semiconductor memory device 100 is used as an SSD, the operation speed of a host connected to the semiconductor memory device 100 may be enhanced.

As another example, the semiconductor memory device 100 may be applied as one of various elements of an electronic device, such as a computer, an ultra mobile personal computer (UMPC), a workstation, a net-book, a personal digital assistant (PDA), a portable computer, a web tablet, a wireless phone, a mobile phone, a smart phone, a digital camera, a digital audio recorder, a digital audio player, a digital picture recorder, a digital picture player, a digital video recorder, a digital video player, a device that is able to transmit and receive wireless information, one of various devices composing part of a home network, one of various devices composing part of a computer network, one of various devices composing part of a telematics network, a radio frequency identifier (RFID) or one of various devices, e.g., an SSD, a memory card, and the like, composing part of a computing system.

As an example, the semiconductor memory device 100 may be packaged as one of various types to be subsequently embedded. For example, the semiconductor memory device 100 may be packaged by one of PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (PMQFP), Thin Quad Flatpack (TQFP), Small Outline Integrated Circuit (SOIC), Shrink Small Outline Package (SSOP), Thin Small Outline (TSOP), System In Package (SIP), Multi Chip Package (MCP), Wafer-level Fabricated Package (WFP), and Wafer-Level Processed Stack Package (WSP).

Figure 2:
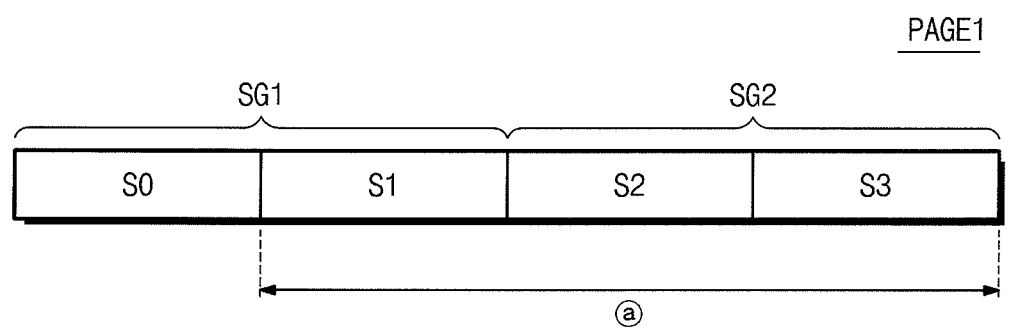
FIG. 2 is a block diagram illustrating a sector configuration of a first page shown in FIG. 1 according to an exemplary embodiment of the inventive concept.

FIG. 2 is a block diagram illustrating a sector configuration of a first page shown in FIG. 1 according to an exemplary embodiment of the inventive concept. Although the sector configuration of the first page PAGE1 will now be described with reference to FIG. 2, the other pages included in the memory cell array 210 may be organized with the same structure as the first page PAGE1.

Referring to FIGS. 1 and 2, the first page PAGE1 corresponds to a first sector group SG1 and a second sector group SG2. The first sector group SG1 corresponds to memory cells connected to even bitlines (see FIG. 1), and the second sector group SG2 corresponds to memory cells connected to odd bitlines (see FIG. 1). Accordingly, memory cells corresponding to the first sector group SG1 are sensed during even sensing, and memory cells corresponding to the second sector group SG2 are sensed during odd sensing.

The first sector group SG1 may include a plurality of sectors. The second sector group SG2 may include a plurality of sectors. Each of the sectors may correspond to memory cells connected to even bitlines or memory cells connected to odd bitlines. In FIG. 2, the first sector group SG1 includes a zeroth sector S0 and a first sector S1, and the second sector group SG2 includes a second sector S2 and a third sector S3.

During a read operation, even sensing and odd sensing are performed to sense data of the first page PAGE1. Among the sensed data of the first page PAGE1, data of sectors corresponding to a sector address (hereinafter referred to as "selected sector") is transferred to the RAM 300.

According to an exemplary embodiment of the inventive concept, during a read operation, the bitline selector 260 determines a sequence of even sensing and odd sensing, based on a sector address. The bitline selector 260 may generate an even bitline selection signal EBS and an odd bitline selection signal OBS according to the determined sequence.

According to an exemplary embodiment of the inventive concept, the bitline selector 260 compares the number of sectors included in the first sector group SG1 with the number of sectors included in the second sector group SG2, among the selected sectors. An even bitline selection signal EBS and an odd bitline selection signal OBS may be generated according to a result of the comparison.

It is assumed that first sensing and second sensing are sequentially performed to sense a page. The first sensing and the second sensing may correspond to even sensing and odd sensing, respectively. According to the determined sequence, the first sensing and the second sensing may correspond to even sensing and odd sensing, respectively. Data sensed during the first sensing may be transferred to the RAM 300 while the second sensing is performed.

As an example, when the number of sectors included in the first sector group SG1 among the selected sectors is greater than that of sectors included in the second sector group SG2 among the selected sectors, the bitline selector 260 generates an even bitline selection signal EBS before generating an odd bitline selection signal OBS.

As an example, when the number of sectors included in the second sector group SG2 among the selected sectors is greater than that of sectors included in the first sector group SG1 among the selected sectors, the bitline selector 260 generates an odd bitline selection signal OBS before generating an even bitline selection signal EBS.

As an example, when the number of sectors included in the first sector group SG1 among the selected sectors is equal to that of sectors included in the second sector group SG2 among the selected sectors, an even bitline selection signal EBS and an odd bitline selection signal OBS may be generated according to a predetermined sequence. For example, the even bitline selection signal EBS may be first generated. For example, the odd bitline selection signal OBS may be first generated.

The read/write circuit 240 may perform even sensing and odd sensing in response to the even bitline selection signal EBS and the odd bitline selection signal OBS.

It is assumed that a sector address corresponds to first to third sectors S1~S3 (case (a)). The number of sectors included in the second sector group SG2 is two and the number of sectors included in the first sector group SG1 is one. In other words, the number of sectors included in the second sector group SG2 is greater than that of sectors included in the first sector group SG1. In this case, the bitline selector 260 may sequentially transfer the odd bitline selection signal OBS and the even bitline selection signal EBS to the read/write circuit 240.

As illustrated In FIG. 2, the first page PAGE1 corresponds to, for example, four sectors. However, when the first page PAGE1 corresponds to a plurality of sectors other than four, the inventive concept may be equivalently applied. In this case, a plurality of sectors may be divided into a first sector group SG1 or a second sector group SG2. The bitline selector 260 may compare the number of sectors included in the first sector group SG1 with the number of sectors included in the second sector group SG2. The bitline selector 260 may generate an even bitline selection signal EBS and an odd bitline selection signal OBS according to a result of the comparison.

Figure 3:
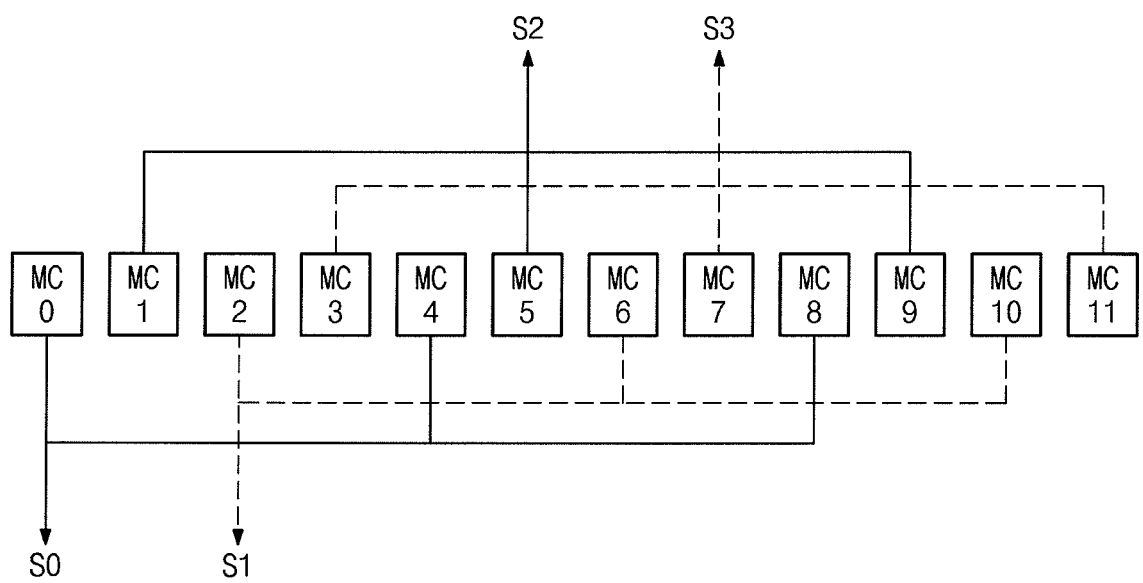
FIG. 3 is a block diagram of memory cells corresponding to zeroth to third sectors shown in FIG. 2, according to an exemplary embodiment of the inventive concept.

FIG. 3 is a block diagram of memory cells corresponding to the zeroth to third sectors S0~S3 shown in FIG. 2, according to an exemplary embodiment of the inventive concept. In other words, the zeroth to third sectors S0~S3 are included in the first page (PAGE1 in FIG. 2).

Referring to FIG. 3, zeroth, fourth, and eighth memory cells MC0, MC4, and MC8 correspond to the zeroth sector S0. Second, sixth, and tenth memory cells MC2, MC6, and MC10 correspond to the first sector S1. First, fifth and ninth memory cells MC1, MC5, and MC9 correspond to the second sector S2. Third, seventh, and eleventh memory cells MC3, MC7, and MC11 correspond to the third sector S3. Except for the zeroth to eleventh memory cells MC0~MC11, the other cells of the first page PAGE1 correspond to the zeroth to third sectors S0~S3 in the same manner.

In other words, under the assumption that k is an integer between 0 and n/4, a 4 kth memory cell may correspond to the zeroth sector S0. A 4(k+1)th memory cell may correspond to the first sector S1. A 4(k+2)th memory cell may correspond to the second sector S2. A 4(k+3)th memory cell may correspond to the third sector S3.

FIG. 3 illustrates an exemplary configuration of sectors corresponding to the first page PAGE1. Each sector of the first page PAGE1 may correspond to memory cells connected to even or odd bitlines (see FIG. 1) according to a predetermined standard.

Figure 4:
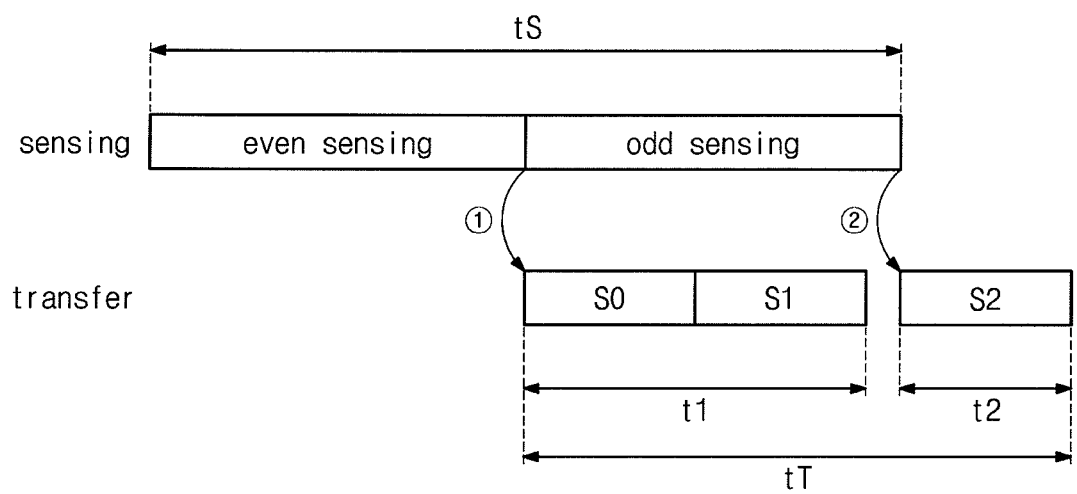
FIG. 4 is a timing diagram illustrating a procedure of transferring data from the first page shown in FIG. 2, according to an exemplary embodiment of the inventive concept.

FIG. 4 is a timing diagram illustrating a procedure of transferring data from the first page PAGE1 shown in FIG. 2, according to an exemplary embodiment of the inventive concept. FIG. 4 illustrates an exemplary case where zeroth to second sectors S0~S2 of the first page PAGE1 are transferred.

Referring to FIGS. 1, 2, and 4, even sensing is performed in the flash memory 200. In other words, the read/write circuit 240 may perform even sensing in response to an even bitline selection signal EBS. When the even sensing is performed, data of memory cells connected to an even bitline may be sensed. In other words, data of memory cells corresponding to the first sector group SG1 may be stored in the read/write circuit 240. As an example, data of the zeroth and first sectors S0 and S1 may be sensed. Thus, data of the zeroth and first sectors S0 and S1 are stored in the read/write circuit 240.

After the even sensing is performed, the odd sensing is performed. In other words, the read/write circuit 240 may perform the odd sensing in response to an odd bitline selection signal OBS. When the odd sensing is performed, data of memory cells corresponding to the second sector group SG2 may be stored in the read/write circuit 240. As an example, data of the second and third sectors S2 and S3 are stored in the read/write circuit 240.

While the odd sensing is performed, data of selected sectors among even-sensed data are transferred to the RAM 300. In FIG. 4, while the even sensing is performed, data of the zeroth and first sectors S0 and S1 are transferred to the read/write circuit 240. Then, while the odd sensing is performed, the read/write circuit 240 may transfer the data of the zeroth and first sectors S0 and S1 corresponding to a sector address to the RAM 300, based on a decoded sector address SS (case (1)). In other words, while the odd sensing is performed, data of selected sectors among even-sensed data are transferred to the RAM 300.

Data of selected sectors among odd-sensed data are also transferred to the RAM 300. In FIG. 4, the odd sensing is performed and data of the second sector S2 is transferred to the RAM 300 (case 2).

According to an exemplary embodiment of the inventive concept, during a read operation, it is determined which one of the first and second sector groups SG1 and SG2 includes more selected sectors and data of sectors included in the sector group determined to have more selected sectors are first sensed. In parallel with a sensing operation that is second performed, data of the selected sectors among the first-sensed data are transferred to the RAM 300. Time required for transferring data of the selected sectors among the first-sensed data is longer than that required for transferring data of the selected sectors among the second-sensed data. In the exemplary embodiment of the inventive concept, when transfer time of first-sensed data and transfer time of second-sensed data overlap each other, reading speed of the semiconductor memory device 100 is improved.

As an example, in FIG. 4, data transfer time t1 of the zeroth and first sectors S0 and S1 is longer than data transfer time t2 of the second sector S2. Reading time of data stored in a flash memory when the data transfer time t1 overlaps sensing time tS may be made shorter than that when the data transfer time t2 overlaps the sensing time tS. In the exemplary embodiment of the inventive concept, when sensing time tS and transfer time tT overlap each other, reading speed of the semiconductor memory device 100 is improved.

Figure 5:
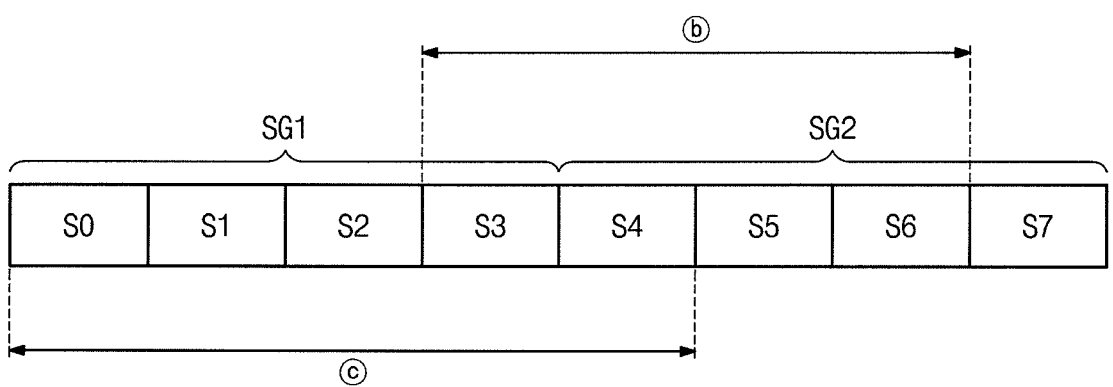
FIG. 5 is a block diagram illustrating a sector configuration of the first page shown in FIG. 1 according to an exemplary embodiment of the inventive concept.

FIG. 5 is a block diagram illustrating a sector configuration of the first page PAGE1 shown in FIG. 1 according to an exemplary embodiment of the inventive concept. Memory cells connected to even bitlines correspond to a first sector group SG1, and memory cells connected to odd bitlines correspond to a second sector group SG2.

As illustrated in FIG. 5, the first page PAGE1 may correspond to, for example, eight sectors. However, the first page PAGE1 may correspond to a plurality of sectors other than eight. In this case, each of the sectors may be included in the first sector group SG1 or the second sector group SG2 according to a predetermined standard.

Referring to FIGS. 1 and 5, the first page PAGE1 may include zeroth to seventh sectors S0~S7. The zeroth to third sectors S0~S3 belong to the first sector group SG1, and the fourth to seventh sectors S4~S7 belong to the second sector group SG2. Data of memory cells corresponding to the first sector group SG1 may be sensed by the read/write circuit 240 through even sensing, and data of memory cells corresponding to the second sector group SG2 may be sensed by the read/write circuit 240 through odd sensing.

According to an exemplary embodiment of the inventive concept, the bitline selector 260 compares the number of sectors included in the first sector group SG1 with the number of sectors included in the second sector group SG2, among selected sectors. A sequence of even sensing and odd sensing is determined according to the comparison result.

As an example, a sector address may include start sector address information and information on the number of sectors. For example, the sector address may include information indicating that a start sector is the third sector S3 and information indicating that the number of sectors is four. In this case, the sector address may correspond to the third to sixth sectors S3~S6 (case b). As another example, the sector address may include information indicating that a start sector is the seventh sector S7 and information indicating that the number of sectors is five. In this case, the sector address may correspond to the zeroth to third sectors S0~S3 and the seventh sector S7.

It is assumed that the sector address corresponds to the third to sixth sectors S3~S6 (case b). Among the selected sectors, the number (three) of sectors included in the second sector group SG2 is greater than the number (one) of sectors included in the first sector group SG1. Therefore, odd sensing may be first performed. After the odd sensing is performed, even sensing may be performed. While the even sensing is performed, data of the fourth to sixth sectors S4~S6 may be transferred to the RAM 300.

It is assumed that the sector address corresponds to the zeroth to fourth sectors S0~S4 (case c). Among the sectors corresponding to the sector address, the number (four) of sectors included in the first sector group SG1 is greater than the number (one) of sectors included in the second sector group SG2. Therefore, even sensing may be first performed. After the even sensing is performed, odd sensing may be performed. While odd sensing is performed, data of the zeroth to third sectors S0~S3 may be transferred to the RAM 300.

Figure 6:
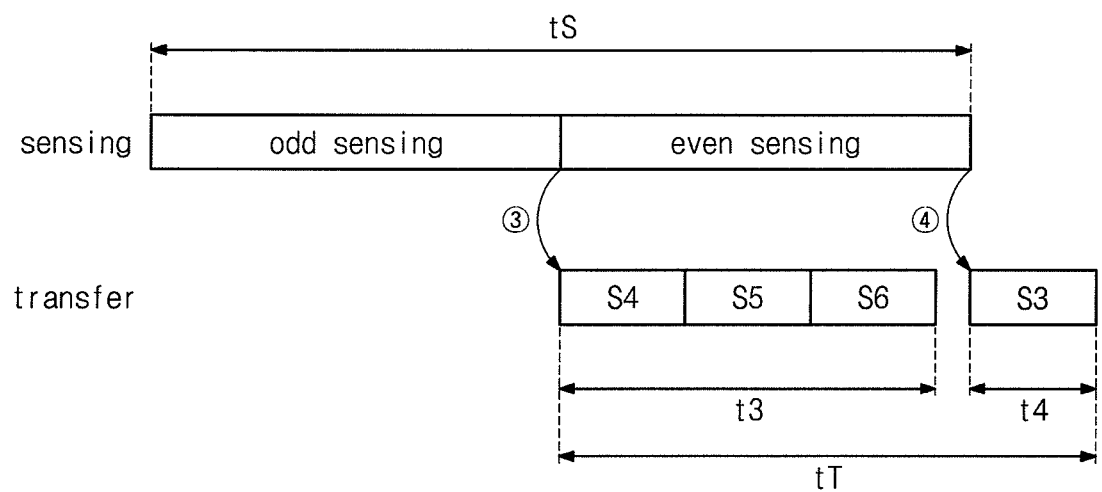
FIG. 6 is a timing diagram illustrating a procedure of reading data stored in the first page shown in FIG. 5, according to an exemplary embodiment of the inventive concept.

FIG. 6 is a timing diagram illustrating a procedure of reading data stored in the first page PAGE1 shown in FIG. 5, according to an exemplary embodiment of the inventive concept. FIG. 6 illustrates an exemplary case where data of third to sixth sectors S3~S6 are read (case b).

Referring to FIGS. 1, 5, and 6, the bitline selector 260 may control the read/write circuit 240 to perform odd sensing first, based on a sector address (identifying sectors S3~S6 to be read) of an address ADDR. Among sectors identified by the sector address, the number of sectors included in the second sector group SG2 is greater than that of sectors included in the first sector group SG1. Therefore, odd sensing is first performed in the flash memory 200.

After the odd sensing is performed, even sensing is performed. While the even sensing is performed, data of selected sectors among odd-sensed data are transferred to the RAM 300. For example, in FIG. 6, while the even sensing is performed, data of the fourth to sixth sectors S4~S6 are transferred to the RAM 300 (case 3).

After the even sensing is performed, data of selected sectors among even-sensed data are transferred to the RAM 300. In this case, data of the third sector S3 may be transferred to the RAM 300 (case 4).

As an example, in FIG. 6, data transfer time t3 of the fourth to sixth sectors S4~S6 is longer than data transfer time t4 of the third sector S3. Read time of data stored in a flash memory when the data transfer time t3 and sensing time tS overlap each other is made shorter than that when the data transfer times t3 and t4 and the sensing time tS overlap each other. In the exemplary embodiment of the inventive concept, when sensing time tS and transfer time tT overlap each other, reading speed of the semiconductor memory device 100 is improved.

Figure 7:
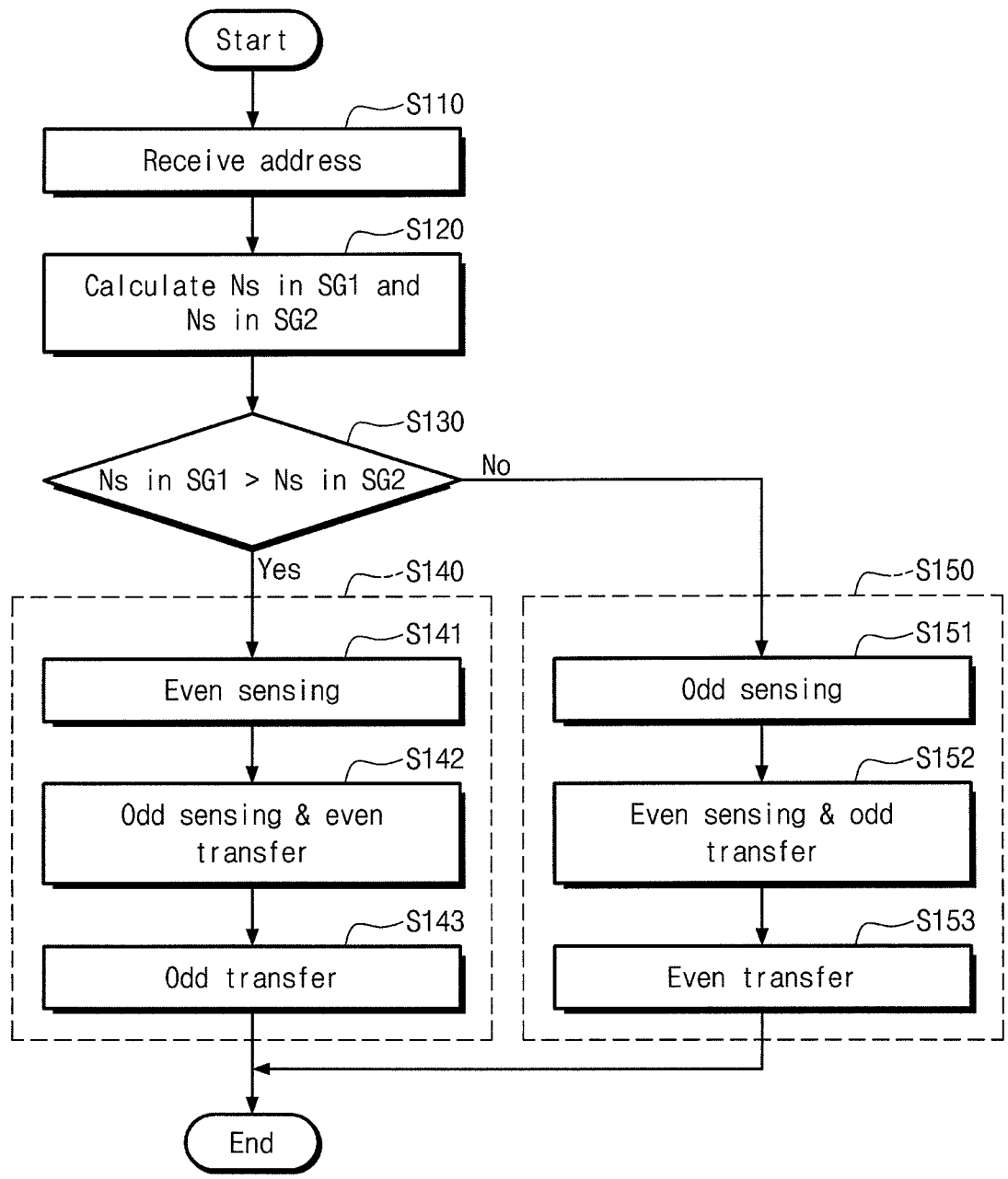
FIG. 7 is a flowchart illustrating a method of transferring data stored in a flash memory shown in FIG. 1 to a random access memory (RAM), according to an exemplary embodiment of the inventive concept.

FIG. 7 is a flowchart illustrating a method of transferring data stored in the flash memory 200 shown in FIG. 1 to the RAM 300, according to an exemplary embodiment of the inventive concept.

Referring to FIGS. 1, 5, and 7, at S110, an address ADDR is received at the flash memory 200 from the memory controller 400. The received address ADDR may include a sector address. As an example, the sector address may include start sector address information and information on the number of sectors.

At S120, the number of sectors included in the first sector group SG1 and the number of sectors included in the second sector group SG2 are calculated. For example, based on the sector address, the bitline selector 260 may calculate the number of sectors included in the first sector group SG1 and the number of sectors included in the second sector group SG2.

At S130, the number of sectors included in the first sector group SG1 is compared with the number of sectors included in the second sector group SG2. For example, based on a result of the calculation at S120, the bitline selector 260 compares the number of sectors included in the first sector group SG1 with the number of sectors included in the second sector group SG2. When the number of sectors included in the first sector group SG1 is greater than the number of sectors included in the second sector group SG2, the flow proceeds to S140. When the number of sectors included in the first sector group SG1 is not greater than the number of sectors included in the second sector group SG2, the flow proceeds to S150. In FIG. 7, when the number of sectors included in the first sector group SG1 is equal to the number of sectors included in the second sector group SG2, the flow proceeds to S150. However, when the number of sectors included in the first sector group SG1 is equal to the number of sectors included in the second sector group SG2, the flow may proceed to S140.

S140 includes S141 (even sensing), S142 (odd sensing and even transfer), and S143 (odd transfer).

At S141, even sensing is performed. When the even sensing is performed, data of sectors included in the first sector group SG1 are sensed. To do this, the bitline selector 260 transfers an even bitline selection signal EBS to the read/write circuit 240. In response to the even bitline selection signal EBS, the even sensing is performed by the read/write circuit 240.

At S142, odd sensing and even transfer are performed. When the odd sensing is performed, data of sectors included in the second sector group SG2 are sensed. In this case, the bitline selector 260 transfers an odd bitline selection signal OBS to the read/write circuit 240. In response to the odd bitline selection signal OSB, the odd sensing is performed by the read/write circuit 240.

While the odd sensing is performed, even transfer is performed. In other words, data of selected sectors among even-sensed data are transferred to the RAM 300 (even transfer). The even transfer is performed based on a decoded sector address SS.

At S143, odd transfer is performed. In other words, data of selected sectors among odd-sensed data are transferred to the RAM 300 (odd transfer). The odd transfer is performed based on the decoded sector address SS.

S150 includes S151 (odd sensing), S152 (even sensing and odd transfer), and S153 (even transfer).

At S151, odd sensing is performed. To do this, the bitline selector 260 transfers an odd bitline selection signal OBS to the read/write circuit 240. In response to the odd bitline selection signal OBS, the read/write circuit 240 performs the odd sensing.

At S152, even sensing and odd transfer are performed. In this case, the bitline selector 260 transfers an even bitline selection signal EBS to the read/write circuit 240. In response to the even bitline selection signal EBS, the read/write circuit 240 performs the even sensing.

While the even sensing is performed, the odd transfer is performed. In other words, while the even sensing is performed, data of selected sectors among odd-sensed data are transferred to the RAM 300. The odd transfer is performed based on a decoded sector address SS received from the sector decoder 230.

At S153, even transfer is performed. In other words, based on the decoded sector address SS, data of selected sectors among even-sensed data are transferred to the RAM 300.

Figure 8:
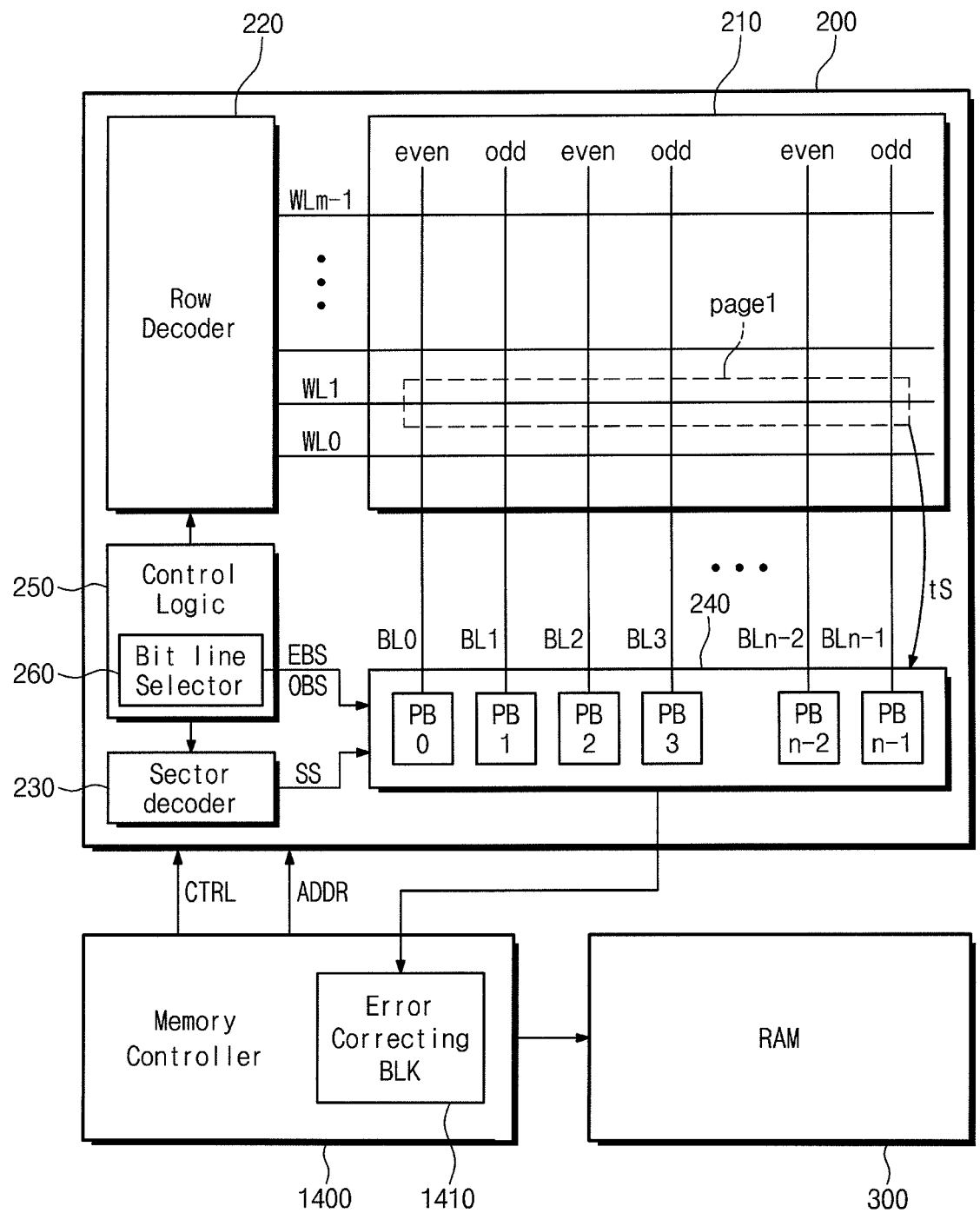
FIG. 8 is a block diagram of a semiconductor memory device which includes an error correcting block, according to an exemplary embodiment of the inventive concept.

FIG. 8 is a block diagram of a semiconductor memory device 1000 which includes an error correcting block 1410, according to an exemplary embodiment of the inventive concept. As illustrated, the semiconductor memory device 1000 includes a flash memory 200, a RAM 300, and a memory controller 1400. Except that the memory controller 1400 includes the error correcting block 1410, the semiconductor memory device 1000 is organized with the same structure as the semiconductor memory device 100 shown in FIG. 1.

As an example, the error correcting block 1410 may include sensed data from the flash memory 200. The error correcting block 1410 may detect and correct an error of received data by using an error correction code (ECC). The corrected data may be transferred to the RAM 300. In the exemplary embodiment of the inventive concept, the semiconductor memory device 1000 may have an improved read speed of data stored in the semiconductor memory device 1000 when sensing time tS and transfer time tT overlap each other, as discussed above.

Figure 9:
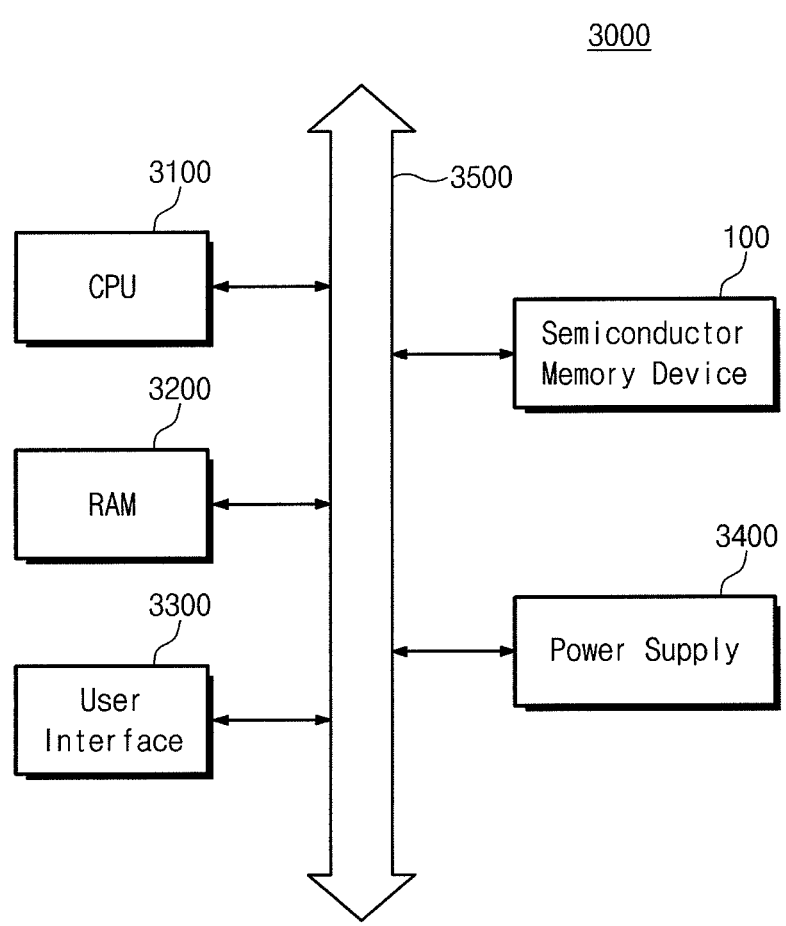
FIG. 9 is a block diagram of a computing system provided with the semiconductor memory device shown in FIG. 1, according to an exemplary embodiment of the inventive concept.

FIG. 9 is a block diagram of a computing system 3000 including the semiconductor memory device 100 shown in FIG. 1, according to an exemplary embodiment of the inventive concept. Unlike that shown in FIG. 9, the computing system 3000 may include the semiconductor memory device 1000 shown in FIG. 8 instead of the semiconductor memory device 100 shown in FIG. 1.

Referring to FIG. 9, the computing system 3000 includes the semiconductor memory device 100, a central processing unit (CPU) 3100, a RAM 3200, a user interface 3300, a power supply 3400, and a system bus 3500.

The semiconductor memory device 100 is electrically connected to the CPU 3100, the RAM 3200, the user interface 3300, and the power supply 3400 through the system bus 3500. Data provided through the user interface 3300 or data processed by the CPU 3100 is stored in the semiconductor memory device 100.

In the exemplary embodiment of the inventive concept, the computing system 3000 may have an improved read speed of data stored in the semiconductor memory device 100 when sensing time tS and transfer time tT overlap each other, as discussed above.

According to the foregoing exemplary embodiments of the inventive concept, during a read operation, the flash memory 200 determines a sequence of even sensing and odd sensing, based on a received sector address, and performs the even sensing and the odd sensing according to the determined sequence. In addition, a second sensing operation and a data transfer operation are performed in parallel. Thus, a semiconductor memory device with an improved data reading function and operating method is provided.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor memory device, comprising:
a flash memory including a page, wherein the page includes a plurality of memory cells connected to even bitlines and odd bitlines of the flash memory, and the memory cells are disposed in a plurality of sectors; and
a memory controller configured to provide the flash memory with a read address that identifies sectors to be read,
wherein the flash memory is configured to determine a sequence of even sensing and odd sensing based on the read address and perform the even sensing and the odd sensing according to the determined sequence; and
the flash memory is configured to sense data of at least one identified sector that includes memory cells connected to the even bitlines during the even sensing and sense data of at least one identified sector that includes memory cells connected to the odd bitlines during the odd sensing,
wherein the memory cells connected to the even bitlines are included in a first sector group and the memory cells connected to the odd bitlines are included in a second sector group; and
the first sector group includes the at least one identified sector that includes memory cells connected to the even bitlines and the second sector group includes the at least one identified sector that includes memory cells connected to the odd bitlines,
wherein the flash memory is configured to compare a number of identified sectors included in the first sector group and a number of identified sectors included in the second sector group and determine the sequence of the even sensing and the odd sensing according to a result of the comparison.

2. A semiconductor memory device, comprising:
a flash memory including a page, wherein the page includes a plurality of memory cells connected to even bitlines and odd bitlines of the flash memory, and the memory cells are disposed in a plurality of sectors; and
a memory controller configured to provide the flash memory with a read address that identifies sectors to be read,
wherein the flash memory is configured to determine a sequence of even sensing and odd sensing based on the read address and perform the even sensing and the odd sensing according to the determined sequence; and
the flash memory is configured to sense data of at least one identified sector that includes memory cells connected to the even bitlines during the even sensing and sense data of at least one identified sector that includes memory cells connected to the odd bitlines during the odd sensing,
wherein the memory cells connected to the even bitlines are included in a first sector group and the memory cells connected to the odd bitlines are included in a second sector group; and
the first sector group includes the at least one identified sector that includes memory cells connected to the even bitlines and the second sector group includes the at least one identified sector that includes memory cells connected to the odd bitlines,
wherein the flash memory is configured to sequentially perform the even sensing and the odd sensing when a number of identified sectors included in the first sector group is greater than a number of identified sectors included in the second sector group; and the flash memory is configured to sequentially perform the odd sensing and the even sensing when the number of identified sectors included in the second sector group is greater than the number of identified sectors included in the first sector group.

3. The semiconductor memory device as set forth in claim 1, further comprising a random access memory (RAM), wherein the flash memory is configured to transfer the data sensed during the even sensing and the data sensed during the odd sensing to the RAM.

4. The semiconductor memory device as set forth in claim 3, wherein, when the odd sensing follows the even sensing, the flash memory is configured to transfer the data sensed during the even sensing to the RAM while the odd sensing takes place.

5. The semiconductor memory device as set forth in claim 3, wherein, when the even sensing follows the odd sensing, the flash memory is configured to transfer the data sensed during the odd sensing to the RAM while the even sensing takes place.

6. The semiconductor memory device as set forth in claim 1, wherein the flash memory and the memory controller are included in a solid state drive (SSD).

7. The semiconductor memory device as set forth in claim 1, wherein the flash memory and the memory controller are included in a memory card.

8. A semiconductor memory device, comprising:
a flash memory including a page, wherein the page includes a plurality of memory cells connected to even bitlines and odd bitlines of the flash memory, and the memory cells are disposed in a plurality of sectors; and
a memory controller configured to provide the flash memory with a read address that identifies sectors to be read,
wherein the flash memory is configured to determine a sequence of even sensing and odd sensing based on the read address and perform the even sensing and the odd sensing according to the determined sequence; and
the flash memory is configured to sense data of at least one identified sector that includes memory cells connected to the even bitlines during the even sensing and sense data of at least one identified sector that includes memory cells connected to the odd bitlines during the odd sensing,
wherein the flash memory further comprises: a read/write circuit connected to the even bitlines and the odd bitlines; and a control logic configured to control the read/write circuit and generate an even line selection signal and an odd line selection signal based on the read address,
wherein the memory cells connected to the even bitlines are included in a first sector group, the first sector group including the at least one identified sector that includes memory cells connected to the even bitlines, and the memory cells connected to the odd bitlines are included in a second sector group, the second sector group including the at least one identified sector that includes memory cells connected to the odd bitlines; and
the control logic sequentially generates the odd line selection signal and the even line selection signal when a number of identified sectors included in the second sector group is greater than a number of identified sectors included in the first sector group, and
the control logic sequentially generates the even line selection signal and the odd line selection signal when the number of identified sectors included in the first sector group is greater than the number of identified sectors included in the second sector group.

9. The semiconductor memory device as set forth in claim 8, wherein the read/write circuit performs the even sensing in response to the even line selection signal and performs the odd sensing in response to the odd line selection signal.

10. The semiconductor memory device as set forth in claim 9, wherein the read/write circuit includes a plurality of page buffers connected to the even bitlines and the odd bitlines respectively and stores the data sensed during the even sensing in the page buffers connected to the even bitlines and the data sensed during the odd sensing in the page buffers connected to the odd bitlines.

11. The semiconductor memory device as set forth in claim 10, further comprising a random access memory (RAM),
wherein the read/write circuit transfers the data stored in the page buffers connected to the even bitlines to the RAM during the odd sensing when the odd sensing follows the even sensing, or
transfers the data stored in the page buffers connected to the odd bitlines during the even sensing when the even sensing follows the odd sensing.

12. A method of operating a semiconductor memory device, wherein the semiconductor memory device includes a flash memory and a memory controller, the flash memory including a page, wherein the page includes a plurality of memory cells connected to even bitlines and odd bitlines of the flash memory, and the memory cells are disposed in a plurality of sectors, the method comprising:
receiving, at the flash memory, a read address from the memory controller, wherein the read address identifies sectors to be read;
determining, at the flash memory, a sequence of even sensing and odd sensing, based on the read address; and
performing, at the flash memory, the even sensing and the odd sensing according to the determined sequence,
wherein data of at least one identified sector that includes memory cells connected to the even bitlines are sensed during the even sensing and data of at least one identified sector that includes memory cells connected to the odd bitlines are sensed during the odd sensing,
wherein the memory cells connected to the even bitlines are included in a first sector group, the first sector group including the at least one identified sector that includes memory cells connected to the even bitlines, and the memory cells connected to the odd bitlines are included in a second sector group, the second sector group including the at least one identified sector that includes memory cells connected to the odd bitlines; and
the determining of the sequence of even sensing and odd sensing comprises comparing a number of identified sectors included in the first sector group and a number of identified sectors included in the second sector group and determining the sequence of the even sensing and the odd sensing according to a result of the comparison.

13. The method as set forth in claim 12, wherein the determining of the sequence of even sensing and odd sensing comprises:
sequentially performing the odd sensing and the even sensing when the number of identified sectors included in the second sector group is greater than the number of identified sectors included in the first sector group; and
sequentially performing the even sensing and the odd sensing when the number of identified sectors included in the first sector group is greater than the number of identified sectors included in the second sector group.

14. The method as set forth in claim 12, wherein the semiconductor memory device further comprises a random access memory (RAM); and the performing of the even sensing and the odd sensing comprises transferring the data sensed during the even sensing to the RAM while the odd sensing takes place when the odd sensing follows the even sensing, or transferring the data sensed during the odd sensing to the RAM while the even sensing takes places when the even sensing follows the odd sensing.

15. The method as set forth in claim 14, further comprising:

receiving a clock signal from an external entity; and outputting the data transferred to the RAM to the external entity in response to the clock signal.

* * * * *